(12) United States Patent
Huang et al.

(10) Patent No.: US 6,984,982 B2
(45) Date of Patent: Jan. 10, 2006

(54) METHOD AND SYSTEM FOR SHIMMING AN MRI MAGNET ASSEMBLY

(75) Inventors: Jinhua Huang, Florence, SC (US); Bu-Xin Xu, Florence, SC (US)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 78 days.

(21) Appl. No.: 10/064,589

(22) Filed: Jul. 29, 2002

(65) Prior Publication Data

US 2004/0017196 A1 Jan. 29, 2004

(51) Int. Cl.
*G01V 3/00* (2006.01)

(52) U.S. Cl. ...................................................... 324/318

(58) Field of Classification Search ......... 324/307–309, 324/318–320, 322; 335/296–306
See application file for complete search history.

(56) References Cited

U.S. PATENT DOCUMENTS

| | | | | |
|---|---|---|---|---|
| 5,220,302 A | * | 6/1993 | Nunnally et al. | 335/301 |
| 5,229,723 A | | 7/1993 | Sakurai et al. | 324/319 |
| 5,235,284 A | * | 8/1993 | Tahara et al. | 324/320 |
| 5,446,434 A | * | 8/1995 | Dorri et al. | 335/301 |
| 5,532,597 A | * | 7/1996 | McGinley et al. | 324/319 |
| 5,550,472 A | * | 8/1996 | Richard et al. | 324/320 |
| 5,635,839 A | * | 6/1997 | Srivastava et al. | 324/320 |
| 5,883,558 A | | 3/1999 | Laskaris et al. | 335/216 |
| 5,923,235 A | * | 7/1999 | Van Oort | 335/301 |
| 5,994,991 A | | 11/1999 | Laskaris et al. | 335/299 |
| 5,999,076 A | * | 12/1999 | Becker et al. | 335/301 |
| 6,011,396 A | * | 1/2000 | Eckels et al. | 324/319 |
| 6,218,839 B1 | * | 4/2001 | Shaikh et al. | 324/320 |
| 6,255,928 B1 | * | 7/2001 | van Oort et al. | 335/301 |
| 6,275,128 B1 | * | 8/2001 | Aoki et al. | 335/299 |
| 6,275,129 B1 | * | 8/2001 | van Oort | 335/301 |
| 6,294,972 B1 | * | 9/2001 | Jesmanowicz et al. | 335/301 |
| 6,313,634 B1 | * | 11/2001 | Kasten | 324/320 |
| 6,351,125 B1 | | 2/2002 | Westphal | |
| 6,429,761 B2 | * | 8/2002 | Laskaris et al. | 335/299 |
| 6,566,991 B1 | * | 5/2003 | Rimkunas et al. | 335/301 |
| 6,670,877 B2 | * | 12/2003 | Rapoport | 335/296 |
| 2002/0097122 A1 | * | 7/2002 | Rapoport | 335/304 |
| 2003/0085704 A1 | * | 5/2003 | Dewdney | 324/318 |

FOREIGN PATENT DOCUMENTS

| | | |
|---|---|---|
| EP | 0407227 | 1/1991 |
| EP | 0626587 | 11/1994 |
| EP | 0694790 | 1/1996 |
| EP | 0965305 | 12/1999 |
| WO | WO 01/55732 | 8/2001 |

OTHER PUBLICATIONS

European Search Report (3ps).

* cited by examiner

*Primary Examiner*—Diego Gutierrez
*Assistant Examiner*—Dixomara Vargas
(74) *Attorney, Agent, or Firm*—Cantor Colburn LLP

(57) ABSTRACT

Described herein is a method and system for shimming an MRI magnetic field generating assembly, wherein a plurality of shims are secured relative to a surface of the magnetic field generating assembly to at least partially correct inhomogeneities in the magnetic field generated by the magnetic field generating assembly. In one aspect, the shims are arranged along a plurality of concentric geometric shapes each having at least five sides. In an alternative aspect, the shims are arranged in a plurality of rows and columns, where the rows are normal to the columns. In another aspect, at least one of the shims is a flat plate of magnetic material including a top edge, a bottom edge, side edges, and face surfaces. The bottom edge is the proximal portion of the flat plate relative to the magnetic field generating assembly, the top edge is the distal portion of the flat plate relative to the magnetic field generating assembly, and the face surfaces are aligned with a direction of the magnetic field generated by the magnetic field generating assembly.

31 Claims, 6 Drawing Sheets

METHOD AND SYSTEM FOR SHIMMING AN MRI MAGNET ASSEMBLY

BACKGROUND

This invention relates to magnetic field shimming systems. More particularly, the invention relates to magnetic field shimming systems for magnetic resonance imaging (MRI) magnet assemblies.

MRI magnet assemblies require an air gap large enough to receive all or part of an object to be scanned, and typically require an intensive, uniform magnetic field exhibiting an accuracy on the order of 10 parts per million (ppm) in a specified imaging volume within the air gap.

One known configuration of an MRI magnet assembly is known as open geometry MRI. Typically, open geometry MRI comprises opposing magnetic field generating assemblies connected to each other by one or more yokes or support members. Another known configuration is known as cylindrical geometry MRI, in which magnetic field generating assemblies and other magnetic field shaping components are arranged around a cylindrical structure.

The magnetic field in an MRI magnet assembly is typically created using permanent magnets, electromagnets, or a combination of the two. For example, one known MRI magnet assembly has a structure in which magnetic pole pieces are fixed facing each other at one end of each of a pair of permanent magnet structures in which an R—Fe—B-based magnet is used as the magnetic field generating element, the other ends are coupled by a yoke, and a static magnetic field is generated within the air gap between the magnetic pole pieces. Another known MRI magnet assembly has electromagnetic coils (including resistive coils, superconducting coils, and the like) wound around air or iron cores for the magnetic field generating element in place of the above-mentioned permanent magnet structures.

The uniformity of the magnetic field is greatly influenced by many factors. These factors include: the properties of the materials used in constructing the MRI magnet, the accuracy of manufacturing the MRI magnet, and the environment in which the MRI magnet is placed. Often times, variations in these and other factors result in an inhomogeneous field, ranging from several hundred ppm to several thousand ppm. To obtain the required uniformity for useful imaging, this field inhomogeneity must be corrected.

One method of correcting field inhomogeneity is to apply shims constructed of magnetic (e.g., ferrous) material and/or permanent magnetic material to opposing surfaces formed on the magnetic field generating assemblies. One example of this arrangement is described in U.S. Pat. No. 5,229,723 to Sakurai et. al. Sakural et. al describe an MRI-dedicated magnetic field generating device for generating magnetic fields within an air gap, including: a pair of permanent magnet assemblies opposite to each other to form an air gap therebetween; yokes for magnetically linking the permanent magnet assemblies; and magnetic pole pieces fixed to air-gap-confronting surfaces thereof. Based on this construction, intensities of the magnetic fields are increased by disposing a plurality of magnetic material segments on the same circle or a concentric circle on the opposing surfaces of the pole pieces or decreased by disposing a plurality of permanent magnet segments having a magnetizing direction opposite to that of the permanent magnet assemblies on the same circle or the concentric circle on the opposing surfaces of the pole pieces; or alternatively both the magnetic material segments and the permanent magnet segments are disposed on the same circle or the concentric circle.

There are, however, several drawbacks to this shimming arrangement. For example, a degree of care and effort must be used during the shimming process to stabilize the shims as they are being placed near the pole face, where they are subjected to the large magnetic forces of the permanent magnet assembly. Such care and effort inherently increases the time required to complete the shimming process.

BRIEF SUMMARY OF THE INVENTION

The above-described drawbacks and deficiencies are overcome or alleviated by a method and system for shimming an MRI magnetic field generating assembly, wherein a plurality of shims are secured relative to a surface of the magnetic field generating assembly to at least partially correct inhomogeneities in the magnetic field generated by the magnetic field generating assembly. In one aspect, the shims are arranged along a plurality of concentric geometric shapes each having at least five sides. In an alternative aspect, the shims are arranged in a plurality of rows and columns, where the rows are normal to the columns. In another aspect, at least one shim is a flat plate of magnetic material including a top edge, a bottom edge, side edges, and face surfaces. The bottom edge is the proximal portion of the flat plate relative to the magnetic field generating element, the top edge is the distal portion of the flat plate relative to the magnetic field generating element, and the face surfaces are aligned with a direction of the magnetic field generated by the magnetic field generating assembly.

The above discussed and other features and advantages of the present invention will be appreciated and understood by those skilled in the art from the following detailed description and drawings.

BRIEF DESCRIPTION OF THE DRAWINGS

Referring to the exemplary drawings wherein like elements are numbered alike in the several Figures.

DETAILED DESCRIPTION

Figure 1:
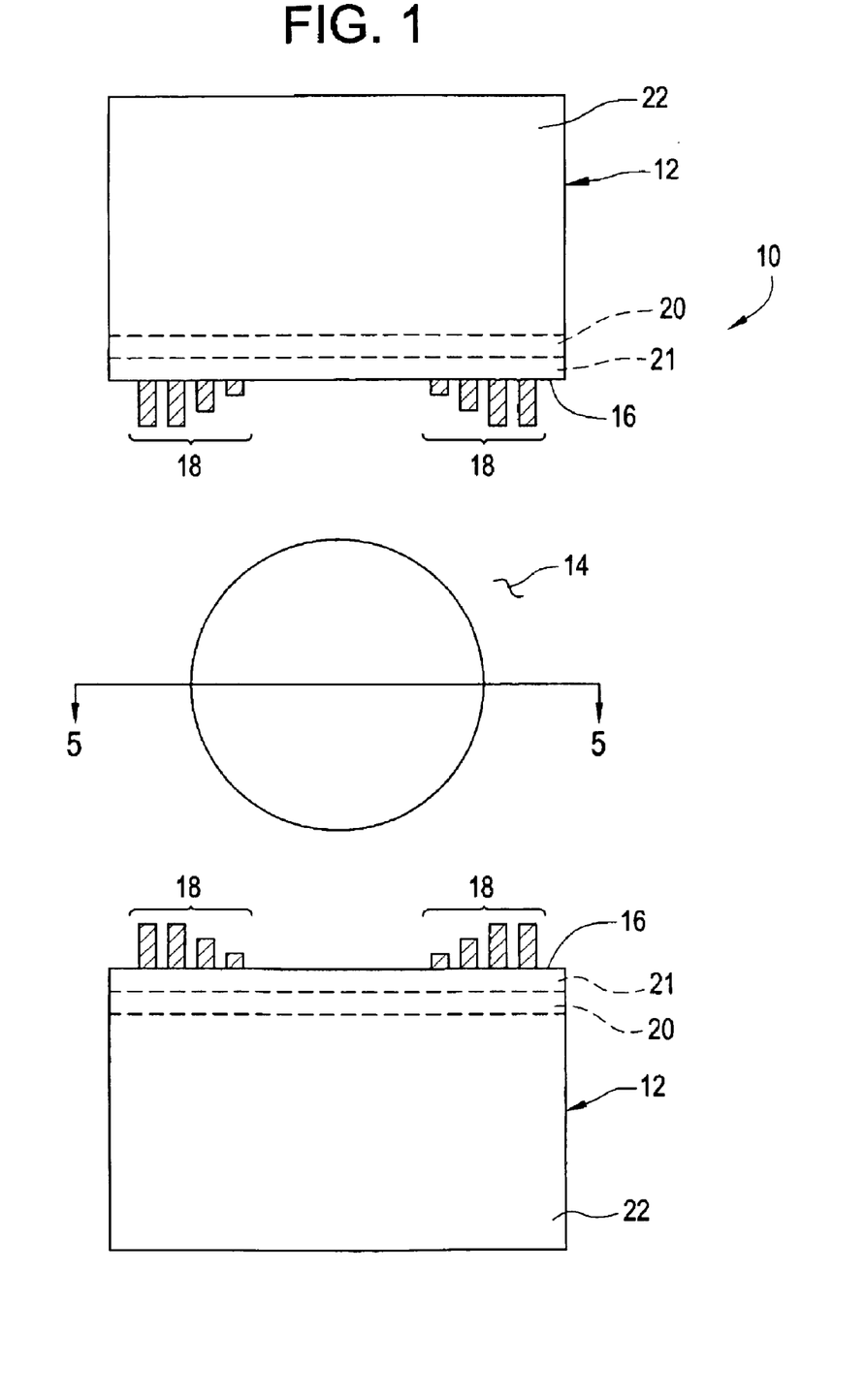
FIG. 1 is a cross-sectional elevation view of an MRI magnet assembly having shims secured to a surface formed thereon.

Referring to FIG. 1, an elevation view of an MRI magnet assembly 10 is shown. The MRI magnet assembly 10 includes opposing magnetic field generating assemblies 12, which generate a magnetic field within an air gap 14 formed between the assemblies 12. Disposed on each of the opposing surfaces 16 of the magnetic field generating assemblies 12 is a plurality of shims 18 arranged to correct inhomogeneities in the magnetic field. The magnetic field generating assemblies 12 may be coupled by one or more yokes or support members (not shown).

The magnetic field generating assemblies 12 may include any type of arrangement for generating a magnetic field in the air gap 14 where opposing surfaces 16 are provided for receiving shims 18 to correct inhomogeneities in the magnetic field. For example, each magnetic field generating assembly 12 may include the magnetic pole piece 20 fastened to one or more magnetic field generating elements 22 and a gradient plate 21 fastened to the magnetic pole piece 20, where opposing surfaces 16 are formed on the opposing surfaces of the gradient plates 21. Such an arrangement is described, for example, in U.S. Pat. No. 6,275,128, entitled "MRI Magnetic Field Generator". In another example, each magnetic field generating assembly 12 may include a magnetic pole piece 20 fastened to one or more magnetic field generating elements 22 with no gradient plate 21, where opposing surfaces 16 are defined on the opposing surfaces of the magnetic pole pieces 20. Such an arrangement is described, for example, in U.S. Pat. No. 5,229,723, entitled "Magnetic Field Generating Device For MRI", in U.S. Pat. No. 5,883,558, entitled "Open Superconductive Magnet Having Shielding", and in U.S. Pat. No. 5,994,991, entitled 'Open Magnet Having Shielding'. In another example, the magnetic field generating assemblies 12 may have no pole pieces 20 or gradient plates 21, with the opposing surfaces 14 being defined on the magnetic field generating elements 22.

The magnetic field generating elements 22 may include permanent magnets, electromagnets (e.g., resistive coils, superconducting coils, and the like), or a combination of the two. Each shim 18 may be constructed of a magnetic (e.g., ferrous) material or a permanently magnetic material.

In the embodiment of FIG. 1, shims 18 are secured to directly to surface 16. Alternatively, shims 18 may be secured to surface 16 using a shim holder 24, as shown in FIGS. 2–4.

Figure 2:
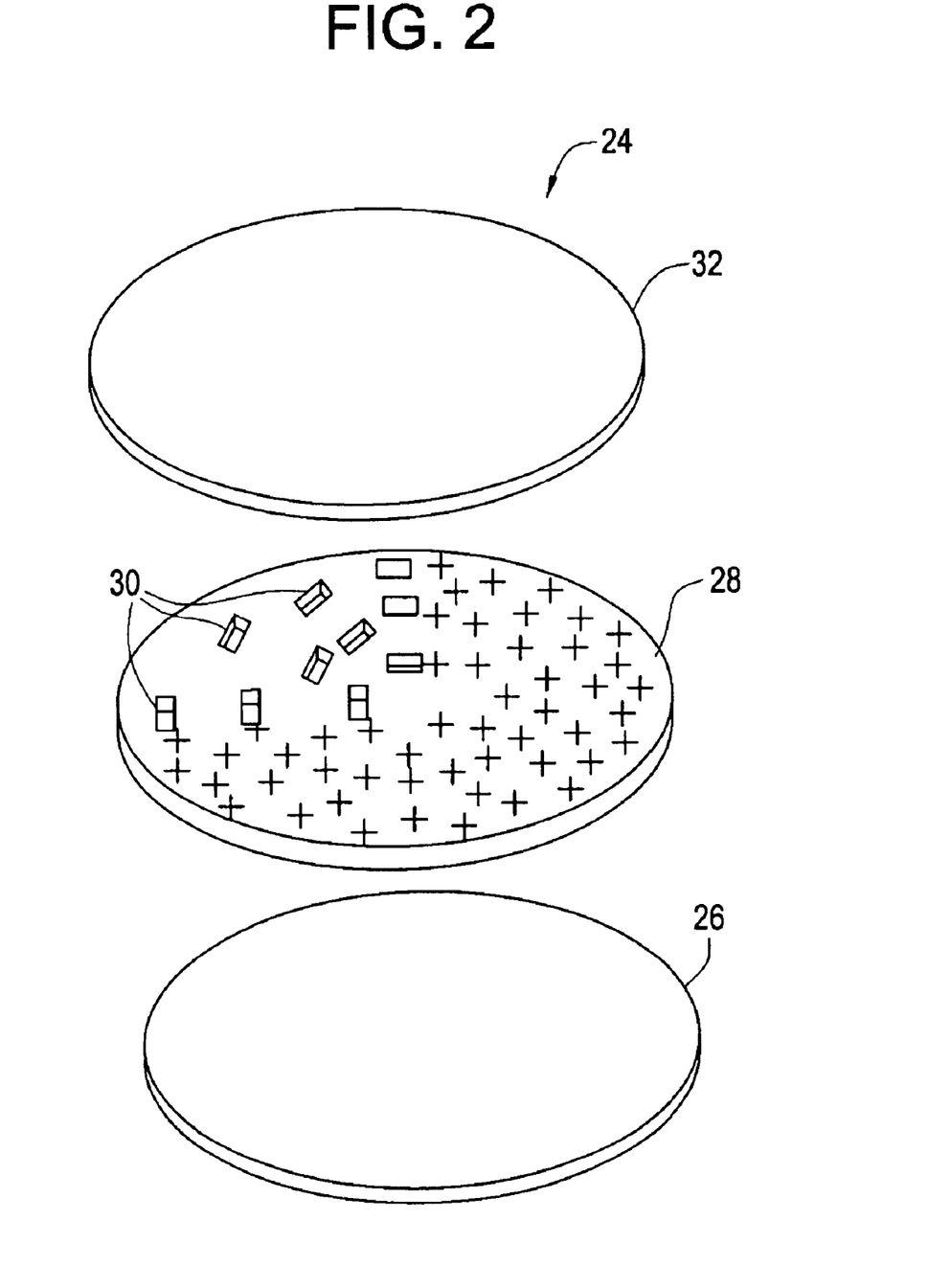
FIG. 2 is an exploded isometric view of a shim holder for an MRI magnet assembly.
Figure 3:
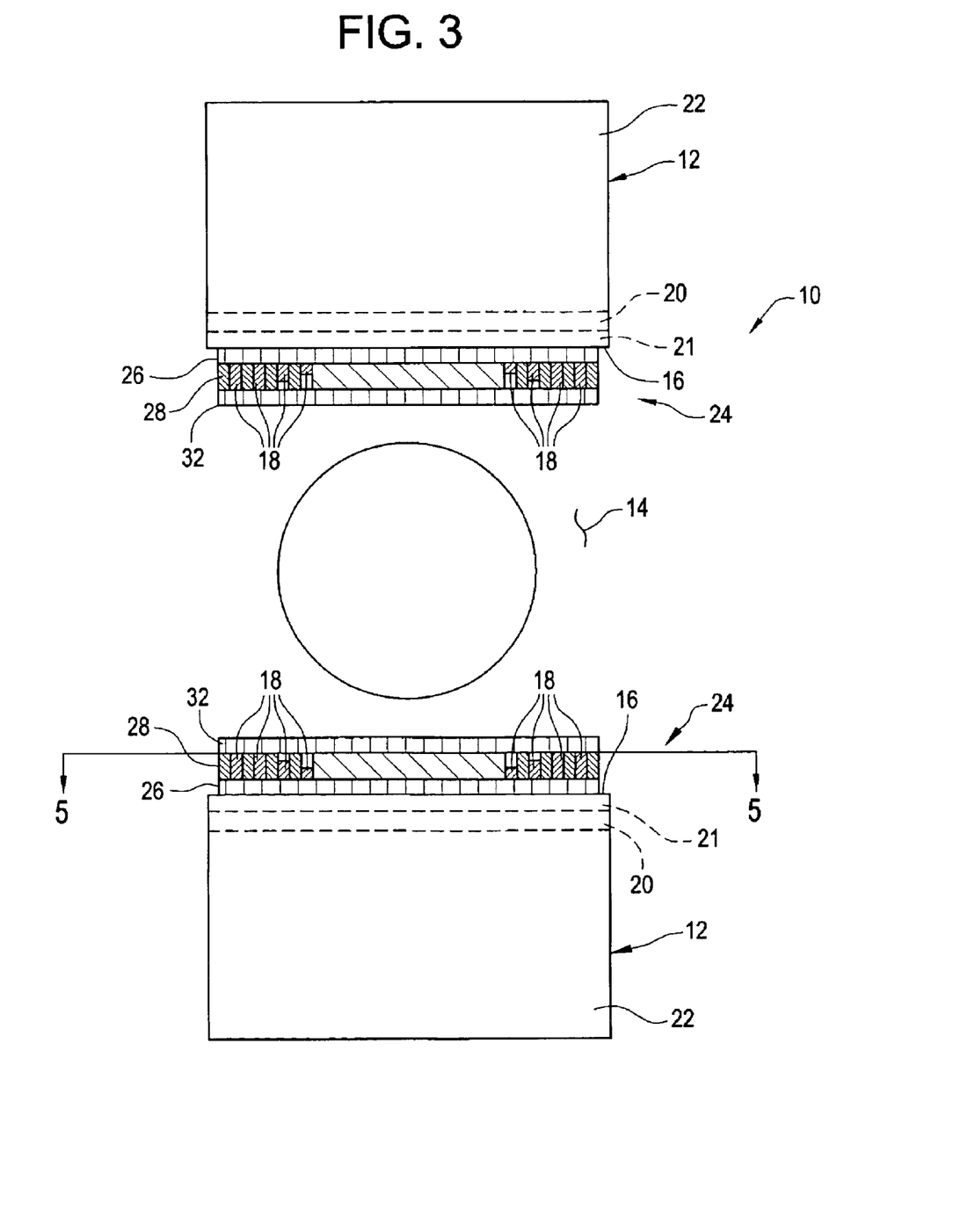
FIG. 3 is a cross-sectional elevation view of an MRI magnet assembly including the shim holder of FIG. 2.
Figure 4:
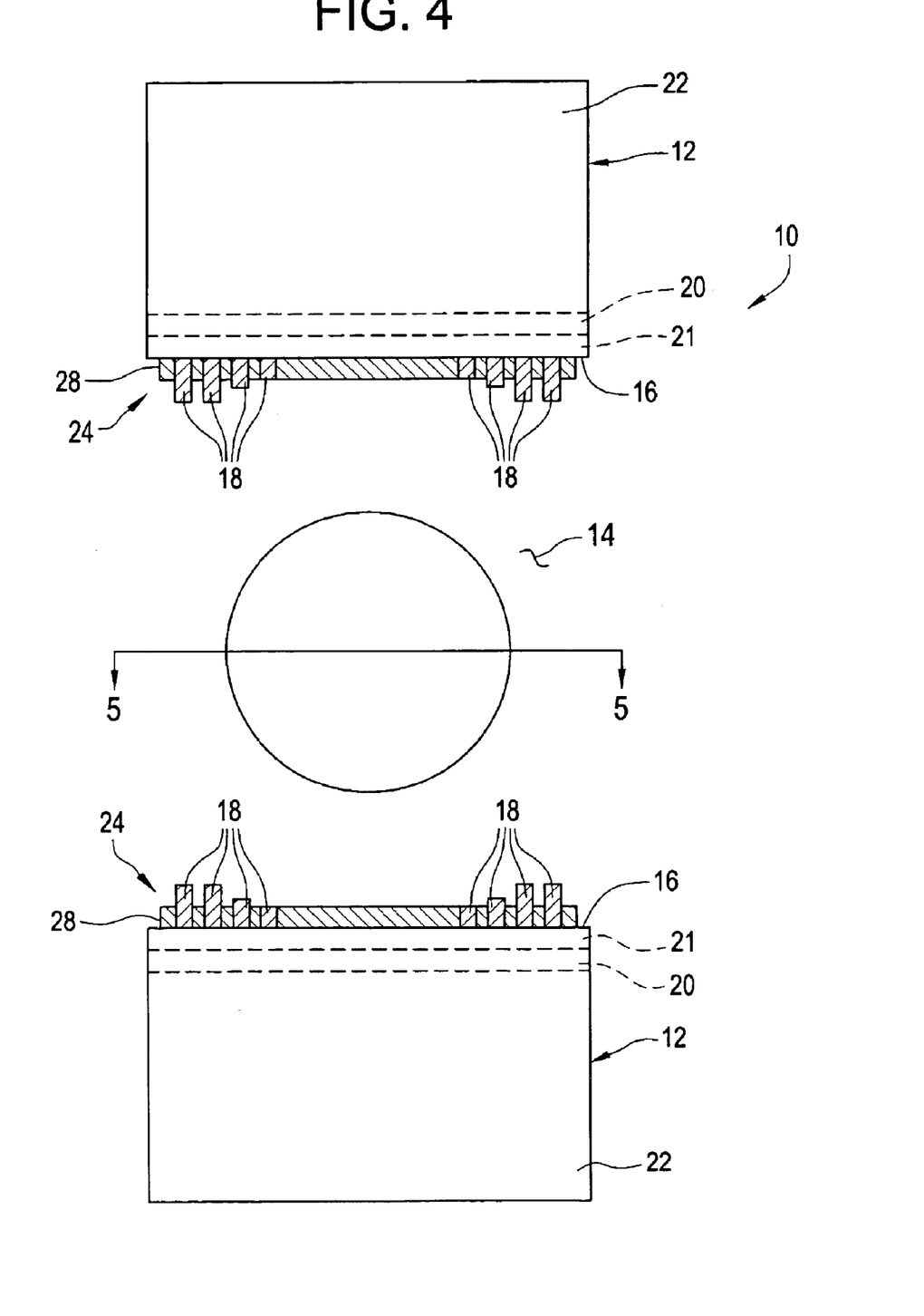
FIG. 4 is a cross-sectional elevation view of an MRI magnet assembly including an alternative shim holder.

Referring to FIGS. 2 and 3, the shim holder 24 may consist of a three-layer, non-magnetic, thin disk, structure including a base disk 26, a holder disk 28 in which have been made holes or slots 30 that serve as pits for accommodating shims 18, and a cover disk 32. The slots 30 that hold the shims 18 are made in the holder disk 28 in a predefined pattern, as will be discussed in further detail hereinafter. Shim holder 24 may be constructed, for example, from a vinyl chloride resin, glass fiber reinforced plastic, or another such non-magnetic material. In an alternative embodiment, the shim holder 24 may comprise a two-layer structure including holder disk 28, and cover disk 32. In another alternative embodiment, shown in FIG. 4, the shim holder 24 may comprise a single-layer structure with slots 30 disposed in holder disk 28. In this embodiment, the shims are directly secured to the shim holder 24. For example, slots 30 may be sized to provide an interference fit between the holder disk 28 and the shims 18. The interference fit between the holder disk 28 and shims 18 provides sufficient friction to stop shim 18 from moving out of the slots 30 under the force of the magnetic field. In another example, shims may be secured to shim holder 24 using an adhesive.

The shim holder 24 may be structured such that the various disks 26, 28 and 32 are suitably disposed and secured in place. In the embodiment of FIGS. 2 and 3, after the holder disk 28 has been placed on and fastened to the base disk 26, the magnetic material shims 18 or permanent magnet shims 18 for adjusting the magnetic field uniformity are inserted into the required slots 30, and if needed, filler material or spacers (not shown) are placed in the gaps between the shims 18 and the cover disk 32 and/or between the shims 18 and the holder disk 28, after which the cover disk 32 is attached to hold everything together. The resulting shim holder 24 is aligned with and fastened to the surface 16. In the embodiment of FIG. 4, the magnetic material shims 18 or permanent magnet shims 18 are secured in the required slots 30, and the resulting shim holder 24 is aligned with and fastened to the surface 16.

Figure 5:
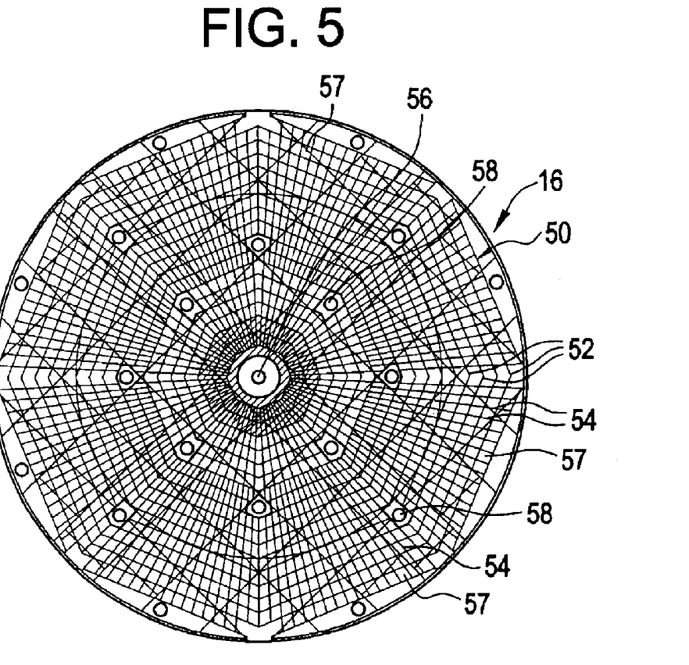
FIG. 5 is a plan view, taken along section 5—5 of FIGS. 1, 3, and 4, of a spider web geometry grid pattern for placement of shims.
Figure 6:
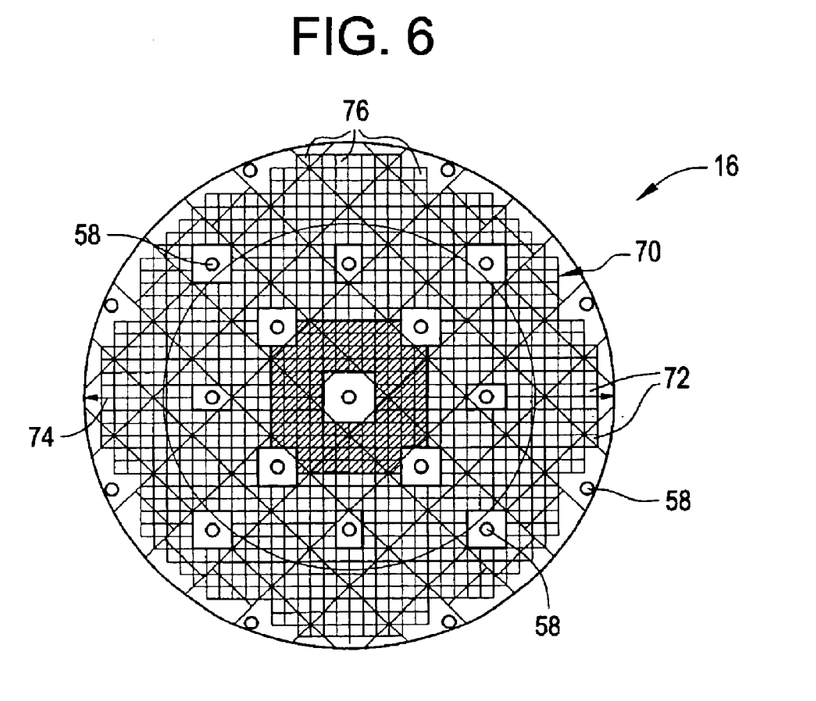
FIG. 6 is a plan view, taken along section 5—5 of FIGS. 1, 3, and 4, of a lattice geometry grid pattern for placement of shims.

Referring to FIG. 5, a plan view of surface 16 is shown having a spider web geometry grid pattern 50 superimposed thereon. Surface 16 of FIG. 5 may be an upper or lower magnetic field generating assembly 12 (FIGS. 1, 3, and 4). The spider web geometry grid pattern 50 is depicted as a two-dimensional grid formed in a plane extending along the surface 16. The grid is formed from a plurality of concentric geometric shapes 52, each having at least five sides, and a plurality of lines 54 radiating from a common center 56 of the geometric shapes 52. In the embodiment of FIG. 6, the concentric geometric shapes 52 are octagons; however, the concentric geometric shapes could be pentagons, hexagons, heptagons, etc. The shims 18 are placed relative to the grid pattern 50. That is, the shims 18 may be placed at the intersections between the radiating lines 54 and the geometric shapes 52, or in the four-sided polygons 57 defined by the radiating lines 54 and the geometric shapes 52, resulting in a plurality of shims arranged along the plurality of concentric geometric shapes. Discontinuities in the grid pattern 50 are provided for fasteners 58, as may be needed, for example, for mounting the shim holder 24 to the surface 16 formed on the gradient plate 21 in the embodiments of FIGS. 2–4.

As described hereinabove, slots 30 accommodate shims 18. Referring to FIG. 5 and the embodiment of FIG. 1, shims 18 may be adhered onto the surfaces 16 in the spider web geometry grid pattern 50. Referring to FIG. 5 and the embodiment of FIGS. 2–4, the shim holder 24 may be constructed by superimposing the spider web geometry grid pattern 50 on the holder disk 28 and disposing slots 30 in holder disk 28 at the intersections or in the four sided polygons 57 in the grid pattern 50.

Referring to FIG. 6, a plan view of a surface 16 is shown having a lattice geometry grid pattern 70 superimposed thereon. The lattice geometry grid pattern 70 is an alternative geometry to the spider web geometry grid pattern 50 of FIG. 5. Surface 16 may be on an upper or lower magnetic field generating assembly 12 (FIGS. 1, 3, and 4). The lattice geometry grid pattern 70 is depicted as a two-dimensional grid formed in a plane extending along the surface 16. The grid pattern 70 is formed from a plurality of equally spaced, parallel lines 72 forming columns, and a plurality of, parallel lines 76 extending normal to the parallel lines 72 forming rows. The shims 18 are placed relative to the grid pattern 70. That is, the shims 18 are placed at the intersections or inside the rectangles formed by the grid pattern 70 to form rows and columns of shims 18. Discontinuities in the grid pattern 70 are provided for fasteners 58, as may be needed, for example, for mounting the shim holder 24 to the surface 16 formed on the gradient plate 21 in the embodiments of FIGS. 2–4.

Referring to FIG. 6 and the embodiment of FIG. 1, shims 18 may be adhered onto the surfaces 16 in the lattice geometry grid pattern 70. Alternatively, referring to FIG. 6 and the embodiment of FIGS. 2–4, the shim holder 24 may be constructed by superimposing the lattice geometry grid pattern 70 on the holder disk 28 and disposing slots 30 in holder disk 28 at the intersections or inside the rectangles in the grid pattern 70. Slots 30 accommodate shims 15.

Various configurations of permanent magnet and magnetic material shims 18 may be applied to correct inhomogeneities in the magnetic field created by magnetic field generating assemblies 12. In one configuration, the material of the shims 18 may be different at different regions in the grid. For example, permanent magnet shims 18 may be positioned in some regions of the grid, while magnetic material shims 18 are positioned at others. In another configuration, inhomogeneities in the magnetic field are corrected by varying the amount of material used in the shims 18 at different regions in the grid. For example, shims 18 having less material may be positioned in some regions of the grid, while shims 18 having more material are positioned at others. In another configuration, the shims 18 may be arranged such that their magnetizing direction is in line with, or opposite to the magnetizing direction of the respective magnetic field generating assembly 12, as needed to make the distribution of the magnetic field uniform. Each of these configurations may be applied separately or in combination.

Because the magnetic field created by magnetic field generating assemblies 12 is greatly influenced by, among other things, the accuracy used in manufacturing the MRI magnet and the environment in which the MRI magnet is placed, correction of the inhomogeneities in the magnetic field is usually performed for each individual MRI magnet assembly after it has been installed in the environment in which it is to be used (e.g., a hospital or laboratory). This correction can be accomplished using any known method to determine the appropriate shim 18 configuration(s) needed to ensure a uniform magnetic field. For example, a linear programming method, such as described in U.S. Pat. No. 5,760,585, entitled "Method for Actively and Passively Shimming A Magnet", may be used. In another example, a harmonic shimming method, such as described in U.S. Pat. No. 5,623,430, entitled "Method for Passively Shimming An Open Magnet", may be used.

In the embodiments of FIGS. 1–6, shim 18 may be constructed of magnetic or permanent magnetic material, as needed to correct inhomogeneities in the magnetic field. Where shim 18 is constructed of permanent magnet material, the shim 18 may be positioned relative to surface 16 using any known arrangement. However, where shim 18 is constructed of magnetic material, it is preferred that shim 18 is arranged as shown in FIG. 7.

Figure 7:
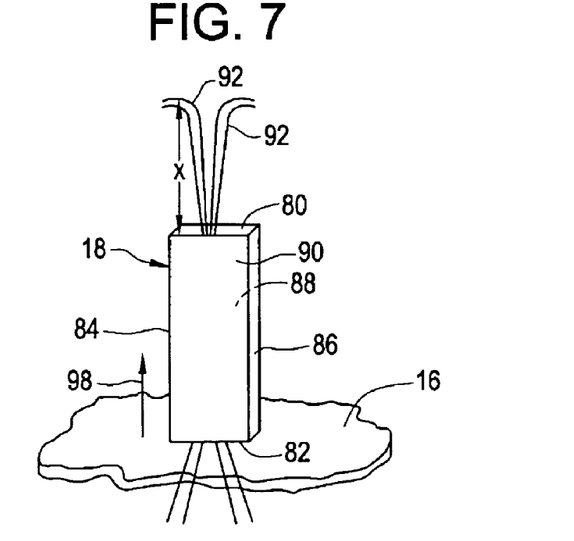
FIG. 7 is an isometric view of a shim arranged proximate a shim holding surface.

Referring to FIG. 7, an example of a magnetic material shim 18 used in the embodiments of FIGS. 1–6 is shown. Magnetic material shim 18 is a flat, rectangular plate having a top edge 80, a bottom edge 82, side edges 84, 86, and opposing face surfaces 88, 90. Bottom edge 82 is positioned proximate to surface 16, and top edge 80 is positioned distal from surface 16 such that face surfaces 88 and 90, which have the largest surface area, are aligned with the direction of the magnetic field generated by magnetic field generating assembly 12, which is indicated by arrow 98. For example, in the embodiment of FIGS. 2 and 3 a magnetic material shim 18 is arranged such that bottom edge 82 contacts base disk 26 and top edge 80 contacts cover disk 32; in the embodiment of FIG. 4, side edges 84, 86 and opposing faces surfaces 88, 90 are captured by holder disk 28 with bottom edge 82 proximate surface 16; and in the embodiment of FIG. 1, bottom edge 82 is adhered to surface 16. Magnetic flux induced in the magnetic material shim 18 is indicated by lines 92, which extend a distance x from top edge 80.

Figure 8A:
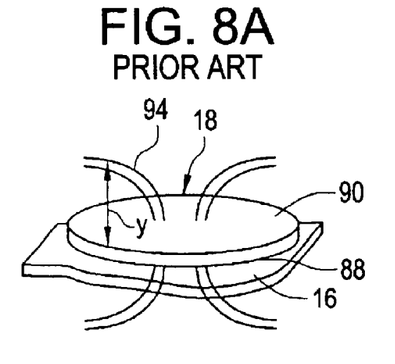
FIG. 8 is an isometric view of a prior art shim arrangement.
Figure 8B:
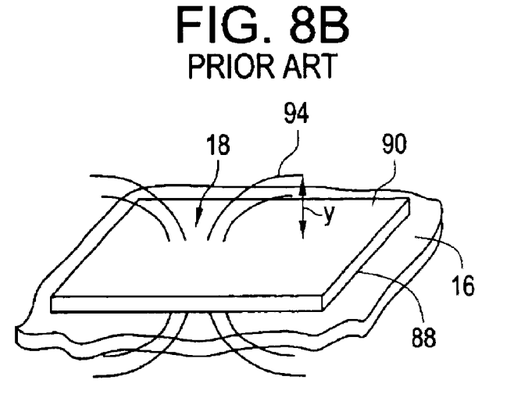

The arrangement of magnetic material shim 18 is different than that used in the prior art, which is shown in FIGS. 8A and 8B. In the prior art, the face 88 of shim 18 is positioned proximate to surface 16, such that the plate-shaped shim 18 lies flat against surface 16. The prior art arrangement will induce a magnetic flux, as indicated by lines 94, which extends a distance y from the surface 90 of the magnetic material shim 15. With all other parameters being equal (e.g., material, size, etc.), the distance y that the magnetic flux extends from the magnetic material shim 18 arranged as in FIGS. 8A and 8B is less than the distance x that the magnetic flux extends from the magnetic material shim 18 arranged as in FIG. 7. In other words, the magnetic material shim 18 arranged as in FIGS. 8A and 8B provides a weaker magnetic field than the magnetic material shim 18 arranged as in FIG. 7. In addition, because the top edge 80 has a much smaller surface area than the surface 90, the magnetic material shim 18 as arranged in FIG. 7 is much more easily magnetized than the magnetic material shim 18 as arranged in FIGS. 8A and 8B. Thus, as a result of arranging the magnetic material shim 18 as shown in FIG. 7, a greater concentration of magnetic flux extends a greater distance into the region of interest for reducing the inhomogeneities in the magnetic field. Because the arrangement of FIG. 7 provides stronger field that extends a greater distance from the magnetic material shim 18, the size of magnetic material shims 18 may be reduced to less than that possible with the prior art arrangement of FIGS. 8A and 8B. Furthermore, because a magnetic material shim 18 tends to align the faces having the largest surface area with the main magnetic field (minimum energy state), the configuration of FIG. 7 places the magnetic material shims 18 in a more stable state, thereby reducing the effort and care that must be taken during the shimming process. As a result, the time to complete the shimming process is reduced below that possible with the shim arrangements of the prior art. Thus, using the shim arrangement of FIG. 7 results in less shim material, reduced shim cost, less shim weight, shorter shimming time than that possible with the prior art arrangement.

Figure 9:
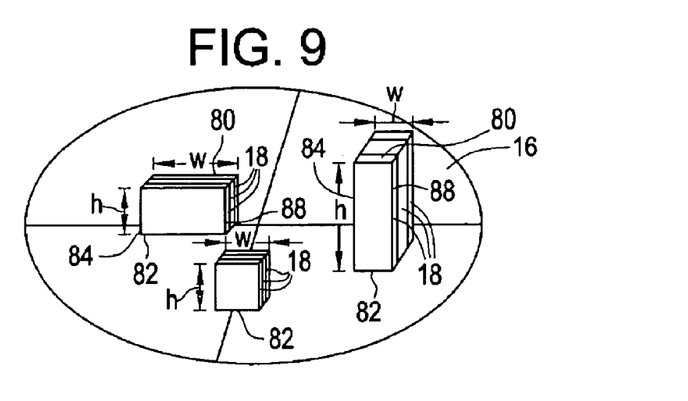
FIG. 9 is an isometric view of a plurality of shims arranged proximate a shim holding surface.

Referring to FIG. 9, a plurality of magnetic material shims 18 are arranged on surface 16 using the configuration of FIG. 7. As shown in FIG. 9, magnetic material shims 18 may be coupled together in groups, with each magnetic material shim 18 having its bottom edge 82 proximate surface 16. The height h and the width w of the magnetic material shims 18 may be varied as needed to reduce the inhomogeneities in the magnetic field induced by the magnetic field generating assemblies 12. The height h being the distance between the top edge 80 and the bottom edge 82, and the width w being the distance between side edges 84 and 86. While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A magnetic field shimming system for an MRI magnetic field generating assembly, the magnetic field shimming system comprising:

plurality of shims secured relative to a surface of the magnetic field generating assembly to at least partially correct inhomogeneitics in a magnetic field generated by the magnetic field generating assembly, said plurality of shims being arranged along a plurality of concentric geometric shapes;

wherein said plurality of shims arranged along a geometric shape of said plurality of concentric geometric shapes includes a first shim having a first amount of material and a second shim having a second different amount of material;

wherein said plurality of shims each have a top edge and a bottom edge separated by a distance h and a center defined by the distance h/2 between said top edge and said bottom edge; and wherein said plurality of centers are allowed to be non-planar.

2. The magnetic field shimming system of claim 1, wherein at least one shim in said plurality of shims is directly coupled to said surface.

3. The magnetic field shimming system of claim 1, wherein said plurality of shims are secured relative to said surface by a shim holder.

4. The magnetic field shimming system of claim 1, wherein at least two shims in said plurality of shims are coupled together in a group, each shim in said at least two shims comprises a flat plate of magnetic material including a top edge, a bottom edge, side edges, and face surfaces, said bottom edge is a proximal portion of said flat plate relative to said surface, said top is a distal portion of said flat plate relative to said surface, and said face surfaces are aligned with a direction of the magnetic field generated by the magnetic field generating assembly.

5. The magnetic field shimming system of claim 4, wherein:
said top edge has a surface area smaller than said face surfaces.

6. A magnetic field shimming system for an MRI magnetic field generating assembly, the magnetic field shimming system comprising:
a first plurality of shims secured relative to a surface of the magnetic field generating assembly to at least partially correct inhomogeneitics in a magnetic field generated by the magnetic field genrating assembly, said first plurality of shims being arranged in a series of columns extending along said surface; and
a second plurality of shims secured relative to said surface to at least partially correct said inhomogeneitics in said magnetic field generated by the magnetic field generating assembly, said second plurality of shims being arranged in a series of rows extending along said surface, said rows being normal to said columns;
wherein said first or said second plurality of shims includes a first shim having a first amount of material and a second shim having a second different amount of material;
wherein said first and second plurality of shims each have a top edge and a bottom edge separated by a distance h and a center defined by the distance h/2 between said top edge and said bottom edge; and
wherein said plurality of centers are allowed to be non-planar.

7. The magnetic field shimming system of claim 6, wherein at least on shim is directly coupled to said surface.

8. The magnetic field shimming system of claim 6, wherein said first and second pluralities of shims are secured relative to said surface by a shim holder.

9. The magnetic field shimming system of claim 6, wherein at least one shim is a flat plate including a top edge, a bottom edge, side edges, and face surfaces, and wherein said at least one shim is arranged such that said bottom edge is a proximal portion of said flat plate relative to said surface, said top edge is a distal portion of said flat plate relative to said surface, and said surfaces are aligned with a direction of the magnetic field generated by the magnetic field generating assembly.

10. The magnetic field shimming system of claim 6, wherein at least two shims are coupled together in a group, each shim in said at least two shims comprises a flat plate including a top edge, a bottom edge, side edges, and face surfaces, said bottom edge is a proximal portion of said edges, and surfaces, said bottom edge is a proximal portion of said flat plate relative to said surface, said top edge is a distal portion of said flat plate relative to said surface, and said face surfaces are aligned with a direction of the magnetic field generated by the magnetic field generating assembly.

11. The magnetic field shimming system of claim 9, wherein:
said top edge has a surface area smaller than said face surfaces.

12. A method for shimming an MRI magnetic field generating assembly, the method comprising:
arranging a plurality of shims in a pattern, said pattern being formed in a plane extending along a surface of the MRI magnetic field generating assembly, said pattern including a plurality of concentric geometric shapes, said plurality of shims each have a top edge and a bottom edge separated by a distance h and a center defined by the distance h/2 between the top edge and the bottom edge, said plurality of shims arranged along a geometric shape of said plurality of concentric geometric shapes including a first shim having a first amount of material and a second shim having a second different amount of material, said arranging allowing said plurality of centers to be non-planar;
wherein at least one shim said plurality of shims is a flat plate of magnetic material including a top edge, a bottom edge, side edges, and face surfaces, and wherein said arranging further includes:
positioning said at least one shim such that said bottom edge is a proximal portion of said flat plate relative to said surface, said top edge is a distal portion of said flat plate relative to said surface, and said face surfaces are aligned with a direction of a magnetic field generated by the magnetic field generating assembly.

13. The method of claim 12, further comprising:
selecting a height of said at least one shim to at least partially correct inhomogeneitics in the magnetic field generated by said magnetic field generating assembly, said height being a distance between said top edge and said botttom edge.

14. The method of claim 13, further comprising:
selecting a width of said at least one shim to at least partially correct inhomogeneitics in the magnetic field generated by said magnetic field generating assembly, said width being a distance between said side edges.

15. The method of claim 12, wherein at least two shims in said plurality of shims each comprise a flat plate of magnetic material including a top edge, a bottom edge, side edges, and face surfaces, and wherein said arranging further includes:

ccoupling said at least two shims; and positioning said at least two shims such that said bottom edge is a proximal portion of said flat plate relative to said surface, said top edge is a distal portion of said flat plate relative to said surface, and said face surfaces are aligned with the direction of the magnetic field generated by the magnetic field generating assembly.

16. A method for shimming an MRI magnetic field generating assembly, the method comprising:

arranging a first plurality of shims in a plurality of columns extending along a surface of the MRI magnetic field generating assembly; and arranging a second a plurality of shims in a plurality of rows extending along said surface, said plurality of rows being normal to said plurality of columns;

wherein said first or said second plurality of shims include a first shim having a first amount of material and a second shim having a second different amount of material;

wherein said first and second plurality of shims each have a top edge and a bottom edge separated by a distance h and a center defined by the distance h/2 between said top edge and said bottom edge; and wherein said arranging allows said plurality of centers to be non-planar.

17. The method of claim 16, wherein at least one shim is a flat plate of magnetic material including a top edge, a bottom edge, side edges, and face surfaces, and wherein said arranging further includes:

positioning said at least one shim such that said bottom edge is a proximal portion of said flat plate relative to said surface, said top edge is a distal portion of said flat plate relative to said surface, and said face surfaces are aligned with a direction of a magnetic field generated by the magnetic field generating assembly.

18. The method of claim 17, further comprising:

selecting a height of said at least one shim to at least partially correct inhomogeneitics in the magnetic field generated by said magnetic field generating assembly, said height being a distance between said top edge and said bottom edge.

19. The method of claim 18, further comprising:

selecting a width of said at least one shim to at least partially correct inhomogeneitics in the magnetic field generated by said magnetic field generating assembly, said width being a distance between said side edge.

20. The method of claim 16, wherein at least two shims each comprise a flat plate of magnetic material including a top edge, a bottom edge, side edges, and face surfaces, and wherein said arranging further includes:

coupling said at least two shims; and positioning said at least two shims such that said bottom edge is a proximal portion of said flat plate relative to said surface, said top edge is a distal portion of said flat plate relative to said surface, and said face surface are aligned with a direction of the magnetic field generated by the magnetic field generating assembly.

21. An MRI assembly comprising:

a magnetic field generating assembly, and a plurality of shims secured relative to a surface of said magnetic field generating assembly for at least partially correcting inhomogeneitics in a magnetic field generated by said magnetic field generating assembly, at least one magnetic shim in said plurality of magnetic material shims is a flat plate of magnetic material including a top edge, a bottom edge, side edges, and face surfaces, and said at least one shim is arranged such that said bottom edge is a proximal portion of said flat plate relative to said surface, said top edge is a distal portion of said flat plate relative to said surface, and said face surfaces are aligned with a direction of the magnetic field generated by said magnetic field generating assembly;

wherein said plurality of shims includes a first shim having a first amount of material and a second shim having a second different amount of material;

wherein said plurality of shims each have a top edge and a bottom edge separated by a distance h and a center defined by the distance h/2 between said top edge and said bottom edge, said plurality of centers being allowed to be non-planar.

22. The MRI magnet assembly of claim 21, wherein said plurality of magnetic material shims are arranged along a plurality of concentric geometric shapes each having at least five sides.

23. The MRI magnet assembly of claim 21, wherein said plurality of magnetic material shims are arranged in a rows and columns.

24. The MRI magnet assembly of claim 21, wherein said at least one shim is secured relative to said surface by a shim holder, said shim holder including a holder disk having a slot disposed therein, said slot receiving said at least one shim.

25. The MRI magnet assembly of claim 24, wherein said shim holder further includes a cover disk to secure said shim within said slot of said holder disk.

26. The MRI magnet assembly of claim 24, wherein said at least one shim is secured directly to said surface.

27. A magentic field shimming system for an MRI magnetic field generating assembly, the magnetic field shimming system comprising:

plurality of shims secured relative to a surface of the magnetic field generating assembly to at least partially correct inhomogeneitics in a magnetic field generated by the magnetic field generating assembly, said plurality of shims being arranged along a plurality of concentric geometric shapes each having at least five sides;

wherein at least one shim in said plurality of shims is a flat plate of magnetic material, said flat plate including a top edge, a bottom edge, side edges, and face surfaces, and wherein said at least one shim is arranged such that said bottom edge is a proximal portion of said flat plate relative to said surface, said top edge is a distal portion of said flat plate relative to said surface, and said face surfaces are aligned with a direction of the magnetic field generated by the magnetic field generating assembly;

wherein said plurality of shims arranged along a geometric shape of said plurality of concentric geometric shapes includes a first shim having a first amount of material and a second shim having a second different amount of material;

wherein said plurality of shims each have a top edge and a bottom edge separated by a distance h and a center defined by the distance h/2 between said top edge and said bottom edge, said plurality of centers being allowed to be non-planar.

28. The magnetic field shimming system of claim 27, wherein:

said top edge has a surface area smaller than said face surfaces.

29. A magnetic field shimming system for an MRI magnetic field generating assembly, the magnetic field shimming system comprising:

a plurality of shims secured relative to a surface of the magnetic field generating assembly to at least partially correct inhomogeneitics in a magnetic field generated by the magnetic field generating assembly, said plurality of shims arranged along a plurality of concentric geometric shapes adapted to receive more than one of said plurality of shims;

wherein said plurality of shims arranged along a geometric shape of said plurality of concentric geometric shapes includes a first shim having a first amount of material and a second shim having a second different amount of material;

wherein said plurality of shims each have a top edge and a bottom edge separated by a distance h and a center defined by the distance h/2 between said top edge and said bottom edge; and wherein said plurality of centers are allowed to be non-planar.

30. The magnetic field shimming system of claim 29, wherein:

each of said plurality of shims have a shape other than the shape of said plurality of concentric geometric shapes.

31. The magnetic field shimming system of claim 29, wherein:

said plurality of shims arranged along one of said plurality of concentric geometric shapes includes a permanent magnet, a magnetic material other than a permanent magnetic, or any combination comprising at least one each of the foregoing materials.

* * * * *

UNITED STATES PATENT AND TRADEMARK OFFICE
CERTIFICATE OF CORRECTION

PATENT NO. : 6,984,982 B2  
APPLICATION NO. : 10/064589  
DATED : January 10, 2006  
INVENTOR(S) : Huang et al.

It is certified that error appears in the above-identified patent and that said Letters Patent is hereby corrected as shown below:

Column 7:  
Line 1, before "plurality" insert "a"  
Line 64, after "least" delete "on" and insert therefor -- one --

Column 8:  
Line 7, after "said" insert "face"  
Lines 15-16, delete "edges, and surfaces said bottom edge is a proximal portion of said"

Column 9:  
Line 67, after "of" delete "magnetic material"

Signed and Sealed this

Eighth Day of January, 2008

JON W. DUDAS  
*Director of the United States Patent and Trademark Office*